United States Patent
Jiao et al.

(10) Patent No.: US 9,647,868 B2
(45) Date of Patent: May 9, 2017

(54) HANDLING SIGNALS

(71) Applicant: Nokia Technologies Oy, Espoo (FI)

(72) Inventors: Xianjun Jiao, Beijing (CN); Xin Zhang, Beijing (CN); Canfeng Chen, Beijing (CN)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/759,609

(22) PCT Filed: Jan. 10, 2013

(86) PCT No.: PCT/CN2013/070333
§ 371 (c)(1),
(2) Date: Jul. 7, 2015

(87) PCT Pub. No.: WO2014/107869
PCT Pub. Date: Jul. 17, 2014

(65) Prior Publication Data
US 2015/0350002 A1 Dec. 3, 2015

(51) Int. Cl.
*H04L 27/38* (2006.01)
*H04B 7/0404* (2017.01)
(Continued)

(52) U.S. Cl.
CPC ............ *H04L 27/389* (2013.01); *G01S 1/042* (2013.01); *G01S 1/08* (2013.01); *G01S 5/0009* (2013.01);
(Continued)

(58) Field of Classification Search
CPC .................................................. H04L 27/389
See application file for complete search history.

(56) References Cited

U.S. PATENT DOCUMENTS

| 8,811,513 B2* | 8/2014 | Jiang | H04B 7/061 370/328 |
| 2001/0031648 A1* | 10/2001 | Proctor, Jr. | H01Q 1/246 455/562.1 |

(Continued)

FOREIGN PATENT DOCUMENTS

| CN | 101043243 | 9/2007 |
| CN | 102742177 | 10/2012 |

OTHER PUBLICATIONS

International Search Report and Written Opinion received for corresponding Patent Cooperation Treaty Application No. PCT/CN2013/070333, dated Oct. 10, 2013, 17 pages.

(Continued)

*Primary Examiner* — Tuan H Nguyen
(74) *Attorney, Agent, or Firm* — Locke Lord LLP

(57) ABSTRACT

Apparatus comprises a memory configured to store a matrix of transmit data; a multi-element antenna; and a transmitter configured to transmit a signal from a multi-element antenna as part of a packet within a transmit period in a switching interval by: switching between different elements of the multi-element antenna in a sequence of transmit intervals within the transmit period; and deriving the signal for transmission in different transmit intervals from different ones of the transmit data in the matrix. Also, apparatus comprises a receiver configured to receive plural packets; and an accumulator configured, for each packet, to accumulate signals received in a switching interval of the packet. The apparatus is configured to: derive a correlation metric for each of the packets from the accumulated signals for the packets; identify a packet with the best correlation metric; identify a direction associated with the packet identified as having the best correlation metric; and provide the direction as an output.

15 Claims, 6 Drawing Sheets

(51) Int. Cl.
*H04W 4/00* (2009.01)
*H04B 7/06* (2006.01)
*G01S 5/00* (2006.01)
*G01S 1/04* (2006.01)
*G01S 1/08* (2006.01)
*H01Q 3/24* (2006.01)
*H03D 1/22* (2006.01)
*H03D 7/16* (2006.01)
*H04B 1/30* (2006.01)
*H04L 27/34* (2006.01)
*H04L 27/36* (2006.01)
*H04B 17/12* (2015.01)
*H04B 17/15* (2015.01)
*H04B 17/16* (2015.01)
*H01Q 1/24* (2006.01)
*H01Q 25/00* (2006.01)
*H04B 7/10* (2017.01)
*G01S 5/04* (2006.01)
*H04W 4/02* (2009.01)
*H04W 4/04* (2009.01)

(52) U.S. Cl.
CPC ............ *H01Q 1/246* (2013.01); *H01Q 3/24* (2013.01); *H01Q 25/001* (2013.01); *H03D 1/22* (2013.01); *H03D 7/166* (2013.01); *H04B 1/30* (2013.01); *H04B 7/0404* (2013.01); *H04B 7/0604* (2013.01); *H04B 7/0691* (2013.01); *H04B 17/12* (2015.01); *H04B 17/15* (2015.01); *H04B 17/16* (2015.01); *H04L 27/34* (2013.01); *H04L 27/36* (2013.01); *H04W 4/008* (2013.01); *G01S 5/04* (2013.01); *H04B 7/10* (2013.01); *H04W 4/025* (2013.01); *H04W 4/026* (2013.01); *H04W 4/043* (2013.01)

(56) References Cited

U.S. PATENT DOCUMENTS

| | | | |
|---|---|---|---|
| 2008/0291817 A1* | 11/2008 | Gupta | H04L 27/2613 370/208 |
| 2009/0147667 A1 | 6/2009 | Kang et al. | |
| 2010/0259450 A1 | 10/2010 | Kainulainen et al. | |
| 2012/0178471 A1 | 7/2012 | Kainulainen et al. | |
| 2012/0202432 A1* | 8/2012 | Salonidis | H04B 7/0491 455/63.4 |

OTHER PUBLICATIONS

Extended European Search Report for European Patent Application No. 13870941.5, Dated Sep. 20, 2016, 9 pages.

* cited by examiner

HANDLING SIGNALS

RELATED APPLICATION

This application was originally filed as PCT Application No. PCT/CN2013/070333 filed Jan. 10, 2013.

FIELD

The present application relates to handling signals.

BACKGROUND

Bluetooth Low Energy (BLE) is a new wireless communication technology published by the Bluetooth SIG as a component of Bluetooth Core Specification Version 4.0. BLE is a lower power, lower complexity, and lower cost wireless communication protocol, designed for applications requiring lower data rates and shorter duty cycles.

Inheriting the protocol stack and star topology of classical Bluetooth, BLE redefines the physical layer specification, and involves many new features such as a very-low power idle mode, a simple device discovery, and short data packets, etc.

BLE technology is aimed at devices requiring a low power consumption, for example devices that may operate with one or more button cell batteries such as sensors, key fobs, and/or the like. BLE can also be incorporated into devices such as mobile phones, smart phones, tablet computers, laptop computers, desktop computers etc.

SUMMARY

Various aspects of examples of the invention are set out in the claims.

A first aspect of the invention provides a method comprising:
  storing a matrix of transmit data; and
  transmitting a signal from a multi-element antenna as part of a packet within a transmit period in a switching interval by:
    switching between different elements of the multi-element antenna in a sequence of transmit intervals within the transmit period; and
    deriving the signal for transmission in different transmit intervals from different ones of the transmit data in the matrix.

The method may comprise transmitting the packet with an identification of a part of the matrix used to derive the signal for transmission.

The method may comprise transmitting the identification of the part of the matrix during an interval absent of switching between the different elements of the multi-element antenna.

The method may comprise transmitting a respective packet for each part of the matrix in a positioning period.

At least some of the elements of the multi-element antenna each may comprise multiple feeds and switching between different elements of the multi-element antenna in a sequence of transmit intervals within the transmit period may comprise switching between different combinations of connections to feeds of the elements of the multi-element antenna. One combination of connections to feeds of the elements of the multi-element antenna may comprise a simultaneous connection to two different feeds of an antenna element.

The method may comprise storing first and third matrices of transmit data; and
  deriving the signal for transmission by:
    producing in-phase and quadrature signals for each transmit interval from different ones of the data in the first and third matrices of transmit data; and
    modulating an input signal with the in-phase and quadrature signals.

The method may comprise storing first and second matrices of transmit data, each matrix relating to a different testing source antenna polarisation;
  switching between the different elements of the multi-element antenna in first and second sequences of transmit intervals within the transmit period;
  deriving the signal for transmission in different transmit intervals for the first sequence from different ones of the transmit data in the first matrix; and
  deriving the signal for transmission in different transmit intervals for the second sequence from different ones of the transmit data in the second matrix.

The method may comprise storing first, second, third and fourth matrices of transmit data, the matrices relating to two different testing source antenna polarisations;
  switching between the different elements of the multi-element antenna in first and second sequences of transmit intervals within the transmit period;
  deriving the signal for transmission in different transmit intervals in the first sequence by producing first in-phase and quadrature signals in each transmit interval from different ones of the data in the first and third matrices of transmit data; and
  deriving the signal for transmission in different transmit intervals in the second sequence by producing second in-phase and quadrature signals in each transmit interval from different ones of the data in the second and fourth matrices of transmit data;
  modulating an input signal with the first in-phase and quadrature signals for the transmit intervals in the first sequence; and
modulating the input signal with the second in-phase and quadrature signals for the transmit intervals in the second sequence. The first and second sequences may comprise identical sequences arranged one after the other.

The sequence may comprise a reference channel at the beginning of the sequence, the end of the sequence and at at least one position between the beginning and the end.

The sequence may comprise two or more different channels between two successive instances of a reference channel, wherein each channel occurs at least twice and wherein the sequence of channels is mirrored at the midpoint between the successive instances of the reference channel.

The different channels each may occur once in the first sequence and once in the second sequence.

Modulating the input signal with the in-phase and quadrature signals may comprise using a complex multiplier to multiply the input signal by the in-phase and quadrature signals. Modulating the input signal with the in-phase and quadrature signals may alternatively comprise using converting the in-phase and quadrature signals to phase and amplitude signals, adjusting the phase of the input signal using the phase signal and adjusting the amplitude of the input signal using the amplitude signal.

The transmit data may comprise calibration data that gives rise to a maximum at an angle to which the corresponding part of the matrix of transmit data relates.

The transmit data may comprise nulling calibration data that gives rise to a minimum at an angle to which the corresponding part of the matrix of transmit data relates.

The method may comprise transmitting the signal as a continuous wave.

The invention also provides a computer program comprising machine-readable instructions that when executed by apparatus comprising a multi-element antenna cause it to perform the method above.

A second aspect of the invention provides a method comprising:
- receiving plural packets;
- for each packet, accumulating signals received in a switching interval of the packet;
- deriving a correlation metric for each of the packets from the accumulated signals for the packets;
- identifying a packet with the best correlation metric;
- identifying a direction associated with the packet identified as having the best correlation metric; and
- providing the direction as an output.

Identifying the direction associated with the packet identified as having the best correlation metric may comprise demodulating information identifying the direction from the packet.

Identifying the direction associated with the packet identified as having the best correlation metric may comprise demodulating information identifying the direction received in a non-switching interval of the packet.

The method may comprise, for each packet:
- first accumulating signals received in a first part of the switching interval of the packet and relating to a first sequence; and
- second accumulating signals received in a second, different part of the switching interval of the packet and relating to a second sequence.

The method may comprise deriving a correlation metric for each of the packets from the first and second accumulated signals for the packets.

The method may comprise deriving a correlation metric for each of the packets by performing a sum of squares operation on the first and second accumulated signals for the packets.

Identifying a packet with the best correlation metric may comprise identifying the packet with the highest correlation metric.

Identifying a packet with the best correlation metric may comprise identifying the packet with the lowest correlation metric.

The method may comprise identifying a packet with the best correlation metric after determining that all packets within a positioning period have been received.

The invention also provides a computer program comprising machine-readable instructions that when executed by apparatus comprising a receiver cause it to perform the method above.

A third aspect of the invention provides apparatus comprising:
- a memory configured to store a matrix of transmit data;
- a multi-element antenna; and
- a transmitter configured to transmit a signal from a multi-element antenna as part of a packet within a transmit period in a switching interval by:
  - switching between different elements of the multi-element antenna in a sequence of transmit intervals within the transmit period; and
  - deriving the signal for transmission in different transmit intervals from different ones of the transmit data in the matrix.

The transmitter may be configured to transmit the packet with an identification of a part of the matrix used to derive the signal for transmission.

The transmitter may be configured to transmit the identification of the part of the matrix during an interval absent of switching between the different elements of the multi-element antenna.

The transmitter may be configured to transmit a respective packet for each part of the matrix in a positioning period.

At least some of the elements of the multi-element antenna may each comprise multiple feeds and switching between different elements of the multi-element antenna in a sequence of transmit intervals within the transmit period may comprise switching between different combinations of connections to feeds of the elements of the multi-element antenna.

One combination of connections to feeds of the elements of the multi-element antenna may comprise a simultaneous connection to two different feeds of an antenna element.

The memory may be configured to store first and third matrices of transmit data; and the transmitter may be configured to derive the signal for transmission by: producing in-phase and quadrature signals for each transmit interval from different ones of the data in the first and third matrices of transmit data; and modulating an input signal with the in-phase and quadrature signals.

The memory may be configured to store first and second matrices of transmit data, each matrix relating to a different testing source antenna polarisation; and the transmitter may be configured to: switch between the different elements of the multi-element antenna in first and second sequences of transmit intervals within the transmit period; derive the signal for transmission in different transmit intervals for the first sequence from different ones of the transmit data in the first matrix; and derive the signal for transmission in different transmit intervals for the second sequence from different ones of the transmit data in the second matrix.

The memory may be configured to store first, second, third and fourth matrices of transmit data, the matrices relating to two different testing source antenna polarisations; and the transmitter may be configured to:
- switch between the different elements of the multi-element antenna in first and second sequences of transmit intervals within the transmit period;
- derive the signal for transmission in different transmit intervals in the first sequence by producing first in-phase and quadrature signals in each transmit interval from different ones of the data in the first and third matrices of transmit data;
- derive the signal for transmission in different transmit intervals in the second sequence by producing second in-phase and quadrature signals in each transmit interval from different ones of the data in the second and fourth matrices of transmit data;
- modulate an input signal with the first in-phase and quadrature signals for the transmit intervals in the first sequence; and
- modulate the input signal with the second in-phase and quadrature signals for the transmit intervals in the second sequence.

The first and second sequences may comprise identical sequences arranged one after the other.

The sequence may comprise a reference channel at the beginning of the sequence, the end of the sequence and at at least one position between the beginning and the end.

The sequence may comprise two or more different channels between two successive instances of a reference channel, wherein each channel occurs at least twice and wherein the sequence of channels is mirrored at the midpoint between the successive instances of the reference channel.

The different channels may each occur once in the first sequence and once in the second sequence.

The transmitter may be configured to modulate the input signal with the in-phase and quadrature signals using a complex multiplier to multiply the input signal by the in-phase and quadrature signals.

The transmitter may be configured to modulate the input signal with the in-phase and quadrature signals by converting the in-phase and quadrature signals to phase and amplitude signals, adjusting the phase of the input signal using the phase signal and adjusting the amplitude of the input signal using the amplitude signal.

The transmit data may comprise calibration data that gives rise to a maximum at an angle to which the corresponding part of the matrix of transmit data relates.

The transmit data may comprise nulling calibration data that gives rise to a minimum at an angle to which the corresponding part of the matrix of transmit data relates.

The transmitter may be configured to transmit the signal as a continuous wave.

A fourth aspect of the invention provides apparatus comprising:
  a receiver configured to receive plural packets; and
  an accumulator configured, for each packet, to accumulate signals received in a switching interval of the packet;
  wherein the apparatus is configured to:
    derive a correlation metric for each of the packets from the accumulated signals for the packets;
    identify a packet with the best correlation metric;
    identify a direction associated with the packet identified as having the best correlation metric; and
    provide the direction as an output.

The apparatus may be configured to identify the direction associated with the packet identified as having the best correlation metric by demodulating information identifying the direction from the packet.

The apparatus may be configured to identify the direction associated with the packet identified as having the best correlation metric by demodulating information identifying the direction received in a non-switching interval of the packet.

The accumulator may be configured, for each packet to:
  first accumulate signals received in a first part of the switching interval of the packet and relating to a first sequence; and
  second accumulate signals received in a second, different part of the switching interval of the packet and relating to a second sequence.

The apparatus may be configured to derive a correlation metric for each of the packets from the first and second accumulated signals for the packets.

The apparatus may be configured to derive a correlation metric for each of the packets by performing a sum of squares operation on the first and second accumulated signals for the packets.

The apparatus may be configured to identify a packet with the best correlation metric by identifying the packet with the highest correlation metric.

The apparatus may be configured to identify a packet with the best correlation metric by identifying the packet with the lowest correlation metric.

The apparatus may be configured to identify a packet with the best correlation metric after determining that all packets within a positioning period have been received.

A fifth aspect of the invention provides a non-transitory computer-readable storage medium having stored thereon computer-readable code, which, when executed by computing apparatus, causes the computing apparatus to perform a method comprising:
  storing a matrix of transmit data; and
  causing transmission of a signal from a multi-element antenna as part of a packet within a transmit period in a switching interval by:
    causing switching between different elements of the multi-element antenna in a sequence of transmit intervals within the transmit period; and
    deriving the signal for transmission in different transmit intervals from different ones of the transmit data in the matrix.

The computer-readable code when executed may cause the computing apparatus to cause transmission of the packet with an identification of a part of the matrix used to derive the signal for transmission.

The computer-readable code when executed may cause the computing apparatus to cause transmission of the identification of the part of the matrix during an interval absent of switching between the different elements of the multi-element antenna.

The computer-readable code when executed may cause the computing apparatus to cause transmission a respective packet for each part of the matrix in a positioning period.

The computer-readable code when executed may cause the computing apparatus to cause transmission between different elements of the multi-element antenna in a sequence of transmit intervals within the transmit period by switching between different combinations of connections to feeds of the elements of the multi-element antenna.

The computer-readable code when executed may cause the computing apparatus to:
  store first and third matrices of transmit data; and
  derive the signal for transmission by:
    producing in-phase and quadrature signals for each transmit interval from different ones of the data in the first and third matrices of transmit data; and
    modulating an input signal with the in-phase and quadrature signals.

The computer-readable code when executed may cause the computing apparatus to:
  store first and second matrices of transmit data, each matrix relating to a different testing source antenna polarisation;
  switch between the different elements of the multi-element antenna in first and second sequences of transmit intervals within the transmit period;
  derive the signal for transmission in different transmit intervals for the first sequence from different ones of the transmit data in the first matrix; and
  derive the signal for transmission in different transmit intervals for the second sequence from different ones of the transmit data in the second matrix.

The computer-readable code when executed may cause the computing apparatus to:
  store first, second, third and fourth matrices of transmit data, the matrices relating to two different testing source antenna polarisations;

switch between the different elements of the multi-element antenna in first and second sequences of transmit intervals within the transmit period;

derive the signal for transmission in different transmit intervals in the first sequence by producing first in-phase and quadrature signals in each transmit interval from different ones of the data in the first and third matrices of transmit data; and derive the signal for transmission in different transmit intervals in the second sequence by producing second in-phase and quadrature signals in each transmit interval from different ones of the data in the second and fourth matrices of transmit data;

modulate an input signal with the first in-phase and quadrature signals for the transmit intervals in the first sequence; and modulate the input signal with the second in-phase and quadrature signals for the transmit intervals in the second sequence.

The first and second sequences comprise identical sequences arranged one after the other.

The sequence may comprise a reference channel at the beginning of the sequence, the end of the sequence and at at least one position between the beginning and the end.

The sequence may comprise two or more different channels between two successive instances of a reference channel, wherein each channel occurs at least twice and wherein the sequence of channels is mirrored at the midpoint between the successive instances of the reference channel.

The different channels may each occur once in the first sequence and once in the second sequence.

The computer-readable code when executed may cause the computing apparatus to modulate the input signal with the in-phase and quadrature signals by using a complex multiplier to multiply the input signal by the in-phase and quadrature signals.

The computer-readable code when executed may cause the computing apparatus to modulate the input signal with the in-phase and quadrature signals may comprise by converting the in-phase and quadrature signals to phase and amplitude signals, adjusting the phase of the input signal using the phase signal and adjusting the amplitude of the input signal using the amplitude signal.

The computer-readable code when executed may cause the computing apparatus to transmit data comprising calibration data that gives rise to a maximum at an angle to which the corresponding part of the matrix of transmit data relates.

The computer-readable code when executed may cause the computing apparatus to transmit data comprising calibration data that gives rise to a minimum at an angle to which the corresponding part of the matrix of transmit data relates.

The computer-readable code when executed may cause the computing apparatus to transmit the signal as a continuous wave.

A sixth aspect of the invention provides a non-transitory computer-readable storage medium having stored thereon computer-readable code, which, when executed by computing apparatus, may cause the computing apparatus to perform a method comprising:

causing receiving of plural packets;

for each packet, accumulating signals received in a switching interval of the packet;

deriving a correlation metric for each of the packets from the accumulated signals for the packets;

identifying a packet with the best correlation metric;

identifying a direction associated with the packet identified as having the best correlation metric; and providing the direction as an output.

The computer-readable code when executed may cause the computing apparatus to identify the direction associated with the packet identified as having the best correlation metric by demodulating information identifying the direction from the packet.

The computer-readable code when executed may causes the computing apparatus to identify the direction associated with the packet identified as having the best correlation metric by demodulating information identifying the direction received in a non-switching interval of the packet.

The computer-readable code when executed may cause the computing apparatus to, for each packet:

first accumulate signals received in a first part of the switching interval of the packet and relating to a first sequence; and second accumulate signals received in a second, different part of the switching interval of the packet and relating to a second sequence.

The computer-readable code when executed may cause the computing apparatus to derive a correlation metric for each of the packets from the first and second accumulated signals for the packets.

The computer-readable code when executed may cause the computing apparatus to derive a correlation metric for each of the packets by performing a sum of squares operation on the first and second accumulated signals for the packets.

The computer-readable code when executed may cause the computing apparatus to identify a packet with the best correlation metric by identifying the packet with the highest correlation metric.

The computer-readable code when executed may cause the computing apparatus to identify a packet with the best correlation metric by identifying the packet with the lowest correlation metric.

The computer-readable code when executed may cause the computing apparatus to identify a packet with the best correlation metric after determining that all packets within a positioning period have been received.

Bluetooth Low Energy or BLE as used herein denotes Bluetooth Core Specification Version 4.0 or later versions that are backwards-compatible with Version 4.0. ABLE device or component is a device or component that is compatible with Bluetooth Core Specification Version 4.0.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF VARIOUS EMBODIMENTS

BLE technology has been proposed to be used in high accuracy indoor positioning (HAIP) systems. HAIP with BLE uses an array of phased antennas to calculate angle-of-departure or angle-of-arrival of a signal. The principles behind calculating the angle-of-departure or angle-of-arrival are described in the prior art.

There are two main options for positioning a mobile device or beacon in a BLE HAIP system. The same applies to other MIMO antenna systems, and to other beamforming systems.

In a first option, the mobiles/tags transmit a BLE positioning packet, which is received at a base station (which can be called a locator) including an antenna array. The base station (or some other device) measures the angle-of-arrival (both azimuth and elevation angles) of the signal using samples of the positioning packet received at different elements of the antenna array, and consequently calculates the position of the mobile/tag. This can be called network-centric positioning. The network-centric approach is limited by capacity.

In a second option, a base station includes an antenna array and transmits a BLE positioning packet from different elements of the antenna array in a way that allows the mobile/tag to calculate the angle-of-departure (both azimuth and elevation angles) of the signal from the base station. The base station here can be termed a beacon. This can be termed mobile-centric positioning. The mobile-centric case is advantageous from the capacity point of view as any number of devices can measure and use broadcast signals for positioning purposes.

A base station or beacon may be able to operate according to both options.

It is the mobile-centric option that is of primary interest in the following, although of course a beacon may operate in the mobile-centric mode as well as the network-centric mode.

Figure 1:
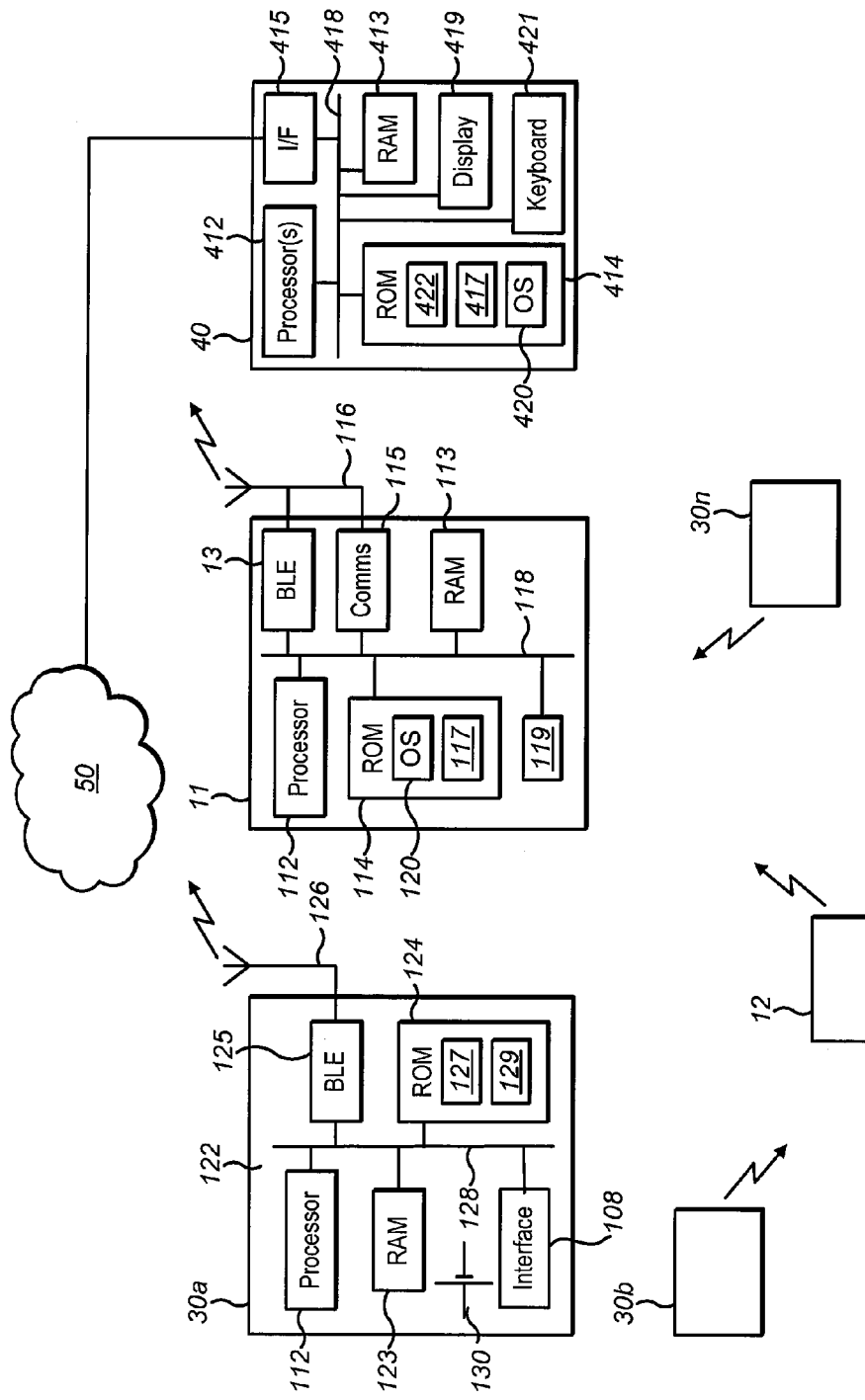
FIG. 1 is a schematic diagram of a system according to aspects of the invention including components according to aspects of the invention and operating according to aspects of the invention.

FIG. 1 shows a system according to embodiments of the invention. The system 10 includes a first device 11 and a second device 12. It also includes first to nth BLE beacons 30a, 30b to 30n, each of which may be referred to as a beacon 30. The system also includes a server 40. The first and second devices 11, 12 are mobile or portable and their locations can be tracked.

Briefly, the BLE beacons 30 are based at different locations within a building or complex of buildings and periodically transmit two different messages. These messages are, firstly, AoD positioning packets and, secondly, positioning advertisement messages. Both the AoD positioning messages and the positioning advertisement messages transmitted by a given beacon 30 include an identifier that is unique to that beacon 30 within the building.

Each of the BLE beacons 30 includes multiple antenna elements and transmits the AoD positioning packets including a certain packet tail called AoD extension. The beacon 30 has multiple antenna elements which are used sequentially during the transmission of the AoD extension. The sequence of antenna elements involves switching between them in a pre-defined order. Each of the first and second devices 11, 12 is able to receive an AoD positioning packet from the BLE beacons 30 and calculate, from parameters of the received signal at the part corresponding to the AoD extension, a bearing from the beacon 30 at which the AoD positioning packet was received at the device 11, 12. The bearing is able to be calculated because of the form given to the signal transmitted along the bearing by the multiple antenna elements.

The positioning advertisement messages include information designating the location and orientation of the beacon 30. They may be sent from only a single element of the antenna 116. The positioning advertisement messages are received at the devices 11, 12.

Both AoD positioning packets and positioning advertisement messages are transmitted periodically, although the AoD positioning packets are transmitted more frequently.

The devices 11, 12 then can calculate their position using information designating the location and orientation of the beacon and the calculated bearing. Devices 11, 12 can calculate their locations having received an AoD positioning packet from one beacon with a reasonable degree of accuracy. Devices 11, 12 can calculate their locations with greater accuracy by triangulating information relating to AoD positioning packets received from two or more beacons, although the accuracy achieved using only one beacon typically is sufficient. Devices 11, 12 are able to calculate their location without network assistance.

The first device 11 includes a BLE module 13, which operates according to the BLE standard. Each of the BLE beacons 30 also includes a BLE module that operates according to the BLE standard.

The first device 11 includes a processor 112. The processor 112 is connected to volatile memory such as RAM 113 by a bus 118. The bus 118 also connects the processor 112 and the RAM 113 to non-volatile memory, such as ROM 114. A communications interface or module 115 is coupled to the bus 118, and thus also to the processor 112 and the memories 113, 114. A BLE module 13 is coupled to the bus 118, and thus also to the processor 112 and the memories 113, 114. An antenna 116 is coupled to the communications module 115 and the BLE module 13, although each may instead have its own antenna. Within the ROM 114 is stored a software application 117. The software application 117 in these embodiments is a navigation application, although it may take some other form. An operating system (OS) 120 also is stored in the ROM 114.

The first device 11 may take any suitable form. Generally speaking, the first device 11 may comprise processing circuitry 112, including one or more processors, and a storage device 114, 113, comprising a single memory unit or a plurality of memory units. The storage device 114, 113 may store computer program instructions that, when loaded into the processing circuitry 112, control the operation of the first device 11.

The BLE module 13 may take any suitable form. Generally speaking, the BLE module 13 of the first device 11 may comprise processing circuitry, including one or more processors, and a storage device comprising a single memory unit or a plurality of memory units. The storage device may store computer program instructions that, when loaded into the processing circuitry, control the operation of the BLE module 13.

The first device 11 also comprises a number of components which are indicated together at 119. These components 119 may include any suitable combination of a display, a user input interface, other communication interfaces (e.g. WiFi, etc.), a speaker, a microphone, and a camera. The components 119 may be arranged in any suitable way.

The BLE module 13 includes a communication stack that is implemented at least partly in software using processor and memory resources (not shown), all of which are included within the BLE module 13. The BLE module 13 is configured, when enabled by the navigation application 117, to calculate the location of the host device 11 as described above, and to report the location to the navigation application 117.

The navigation application 117 is configured to control the BLE module 13 to switch between a positioning mode in which it calculates the position of the host device 11, 12 and a non-positioning mode in which it does not calculate the position of the host device 11, 12, as required by the navigation application 117.

The navigation application 117 may for instance control the BLE module to reside in the positioning mode when positioning has been enabled by the user or by the operating system 120 and when outdoor positioning (e.g. GPS) is unavailable, and to reside in the non-positioning mode otherwise. Alternatively, the navigation application 117 may for instance control the BLE module to reside in the positioning mode when positioning has been enabled by the user or by the operating system 120 and when BLE positioning advertisement messages have been received within a certain time period (e.g. 10 minutes before the current time), and to reside in the non-positioning mode otherwise.

The second device 12 may be configured and operate in the same way as the first device 11.

The devices 11, 12 may be mobile phones, smart phones, tablet computers, laptop computers, cameras, mp3-players, equipment integrated within vehicles, etc. The devices 11, 12 may be based around any suitable operating system, for instance the Symbian operating system or Microsoft Windows operating system, although any other operating system may instead be used. The devices 11, 12 may run different operating systems.

The beacon 30 includes a BLE module 125, an antenna 126, a source of power 130, a processor 112, RAM 123, ROM 124, software 127 and a bus 128. All these components are constituted and connected in any suitable way. The ROM 124 of the beacon 30 also stores information 129. The information 129 includes an identifier that identifies the beacon 30, the location of the beacon, and the orientation of the beacon.

The beacon 30 includes a communication interface 108, using which communications can be received from the server 40. The server 40 may be connected either directly or indirectly with the beacon 30. The server 40 may be connected with the beacon 30 by Ethernet.

The source of power 130 may be for instance a power-over-Ethernet source, a battery, or mains power. The source of power 130 powers the BLE module 121 and any other components of the beacon 30.

The BLE module 125 of the beacon 30 may solely be a transmitter and may not perform receiver functions. The BLE module 125 may include hardware needed for receiving, the receive function being disabled through the software 127. Alternatively, the BLE module 125 may be absent of some of the hardware needed for receiving. Put another way, it may be a transmitter or it may be a transceiver in which the receive functions have been disabled in software. The BLE module 125 may alternatively include receive functionality.

Each of the BLE beacons 30 includes multiple antenna elements (indicated together at 126 in the Figure) and transmits AoD positioning messages using these multiple antenna elements in a switched sequence. By transmitting the AoD positioning messages in this way, a device 11, 12 can calculate from parameters of the received signal that included the AoD positioning message an angle (actually, both azimuth and elevation angles) from the beacon 30 at which the device 11, 12 is located.

Each of the BLE beacons 30 also is configured to transmit information designating the location and orientation of the beacon 30. This information forms part of the positioning advertisement messages. As such, devices 11, 12 can calculate their locations having received an AoD positioning packet from one beacon 30 with a reasonable degree of accuracy. Devices 11, 12 can calculate their locations with greater accuracy by triangulating or by combining location information relating to AoD positioning message received from two or more beacons, although the accuracy achieved using only one beacon typically is sufficient. Devices 11, 12 are able to calculate their location without network assistance. Additionally, the beacons 30 do not need to receive communications from the devices 11, 12 in order to allow the devices 11, 12 to calculate their positions from the received AoD positioning message.

Positioning advertisement messages may be transmitted by each beacon 30 periodically, for instance at 1 Hz (1 second intervals) or 2 Hz (0.5 second intervals) or at intervals defined by some component within the system. They may alternatively be transmitted on request of some component within the system.

AoD positioning messages may be transmitted by each beacon 30 periodically, for instance at 20 Hz (50 millisecond intervals). Clearly, devices 11, 12 can calculate their positions at the same periodicity, or the devices 11, 12 can filter multiple measurements for better accuracy. Such a frequency of transmission of AoD positioning messages allows rapid and reliable positioning updates for the devices 11, 12.

The beacon 30 may take any suitable form. Generally speaking, the beacon 30 may comprise processing circuitry, including one or more processors, and a storage device, comprising a single memory unit or a plurality of memory units. The storage device may store computer program instructions that, when loaded into the processing circuitry, control the operation of the beacon 30.

The other beacons 30b . . . 30n may be configured and operate in the same way as the first beacon 30a. The other beacons are different to the first beacon 30a at least in that the information 129 stored in the ROM 124 includes a different identifier and a different location, and may also include a different orientation of the beacon.

The server 40 includes a processor 412. The processor 412 is connected to volatile memory such as RAM 413 by a bus 418. The bus 418 also connects the processor 112 and the RAM 413 to non-volatile memory, such as ROM 414. A communications interface 415 is coupled to the bus 418, and thus also to the processor 412 and the memories 413, 414. The interface 415 is connected to the radio network 50 in any suitable way, for instance via the Internet or a local network. Within the ROM 414 is stored a software application 417. An operating system (OS) 420 also is stored in the ROM 414. Within the ROM 414 is also stored a location database 422.

An output device such as a display 419 may be provided with the server 40. An input device such as a keyboard 421 may be provided with the server 40.

The server 40 may take any suitable form. Generally speaking, the server 40 may comprise processing circuitry 412, including one or more processors, and a storage device 414, 413, comprising a single memory unit or a plurality of memory units. The storage device 414, 413 may store computer program instructions that, when loaded into the processing circuitry 412, control the operation of the server 40.

Some further details of components and features and alternatives for them will now be described.

The computer program instructions 117 may provide the logic and routines that enables the first device 11 to perform the functionality described below. The computer program instructions 117 may be pre-programmed into the first device 11. Alternatively, they may arrive at the first device 11 via an electromagnetic carrier signal or be copied from a physical entity such as a computer program product, a non-volatile electronic memory device (e.g. flash memory) or a record medium such as a CD-ROM or DVD. They may for instance be downloaded to the first device 11 from a server, for instance the server 40 but possibly another server such as a server of an application marketplace or store.

The processing circuitry 112, 122, 412 may be any type of processing circuitry. For example, the processing circuitry may be a programmable processor that interprets computer program instructions and processes data. The processing circuitry may include plural programmable processors. Alternatively, the processing circuitry may be, for example, programmable hardware with embedded firmware. The processing circuitry or processor 112, 122, 412 may be termed processing means.

Typically, the BLE modules 13, 121 each comprise a processor coupled connected to both volatile memory and non-volatile memory. The computer program is stored in the non-volatile memory and is executed by the processor using the volatile memory for temporary storage of data or data and instructions.

The term 'memory' when used in this specification is intended to relate primarily to memory comprising both non-volatile memory and volatile memory unless the context implies otherwise, although the term may also cover one or more volatile memories only, one or more non-volatile memories only, or one or more volatile memories and one or more non-volatile memories. Examples of volatile memory include RAM, DRAM, SDRAM etc. Examples of non-volatile memory include ROM, PROM, EEPROM, flash memory, optical storage, magnetic storage, etc.

Each BLE module 13, 121 may be a single integrated circuits. Each may alternatively be provided as a set of integrated circuits (i.e. a chipset). The BLE modules 13, 121 may alternatively be hardwired, application-specific integrated circuits (ASIC).

The communication interface 115 may be configured to allow two-way communication with external devices and/or networks. The communication interface may be configured to communicate wirelessly via one or more of several protocols such as Global System for Mobile Communications (GSM), Code Division Multiple Access (CDMA), Universal Mobile Telecommunications System (UMTS) and IEEE 802.11 (Wi-Fi). Alternatively or additionally, the communication interface 115 may be configured for wired communication with a device or network.

The apparatus 11, 12, 40, 30 may comprise further optional software components which are not described in this specification since they may not have direct interaction with the features described.

The BLE beacons 30 are distributed around a building or premises. For instance a first beacon 30a may be located in a canteen, a second beacon 30b may be located in a reception area, and so on. The first and second beacons 30a and 30b can be referred to as beacons 30. Beacons 30 do not need to provide complete coverage of a building, but advantageously are provided to provide good coverage of all key locations within the building.

It is possible in a HAIP system to have a flat array antenna 126 with P elements, with each element having two separate feeds for orthogonal polarisations. K paths or channels are constructed to transmit or receive signal through the array antenna, where $K=2*P+1$. The factor of 2 is derived from there being two feeds with orthogonal polarisations per antenna element. The addition of 1 is included because one extra path is constructed by combining the two different polarisation feeds of a one antenna element that is nominated as a central antenna element.

Each path is defined by a different combination of antenna element, antenna element polarisation (as determined by choice of feed to the antenna element). Each path may be termed a channel. In the following, the terms 'path' and 'channel' are used interchangeably (or together). It will be appreciated that the provision of 5 paths/channels is merely illustrative and that in a typical implementation there will be a significantly greater number of paths/channels.

To perform positioning function, a calibration matrix of the array antenna is firstly obtained by measurement in a test chamber.

By dividing the azimuth angle range 0~360 degree into M grids and the elevation angle range 0~90 degree into N grids, cross polarisation calibration/testing source (vertical polarisation and horizontal polarisation) signals are recorded in every channel/path and at every azimuth and elevation angle grid. Each recorded signal is represented by I and Q values. Here, the calibration matrix is a four dimensional (4-D) matrix $C[4][N][M][K]$, where the first two elements in the first dimension represent I and Q values from the vertical polarised source and the following two elements in the first dimension represent I and Q values from the horizontal polarised source. In summary, the calibration matrix measurement is performed by recording array responses of all channels/paths when signal are incident from all possible azimuth and elevation angles and from two respective testing source antenna polarisations.

When performing positioning, the signal is received from (in network-centric mode) or transmitted to (in mobile-centric mode) mobile devices 11, 12. A positioning algorithm running in the receiving device (e.g. the mobile device 11, 12) receives K channel/path signals and searches for the most likely K-dimension data in the calibration matrix. From this, the receiving device makes a decision as to which position in the azimuth and elevation grid the signal originates.

In mobile-centric positioning mode, the system works as an inverse like form of calibration matrix measurement. The array-antenna 126 broadcasts a continuous wave, which can be viewed as '1' in the baseband complex model before modulation, from each channel/path sequentially, in a particular switching pattern. The mobile device 11, 12 receives the signals emitted from all channels/paths within a period of time. According to the reciprocal theory of radio wave propagation, the mobile device 11, 12 actually receives the response of all channels/paths just like the recorded response in the chamber measurement. The positioning algorithm running within the mobile device 11, 12 performs correlation between the received signal vector and the calibration matrix.

It will be appreciated here that the calibration matrix has N*M signal vectors, which represent the array response from N*M azimuth-elevation angle pairs. Thus, N*M correlations are performed and from the most similar vector the corresponding azimuth-elevation angles pair can be found.

There are three potential problems with mobile-centric direction finding.

The first is that the mobile devices 11 would usually need to store a calibration matrix relating to calibration of the antenna to perform the algorithm. This gives rise to a number of sub-problems. The first is that the calibration matrix need to be stored locally in the mobile device, consuming memory capacity. The second is that the time taken to receive the calibration matrix over an air interface can be significant, especially when the array-antenna 126 has many elements and thus provides many paths. If the calibration matrix is compressed before transmission over the air, positioning accuracy may decrease.

Lastly, if the mobile device 11, 12 is required to obtain the calibration matrix from a server 40, the mobile device 11, 12 needs network accessing ability, such as WiFi, 2G, 3G, 4G, which means higher cost, power consumption, weight, etc.

The second problem is that mobile devices 11, 12 have to do searching in the entire azimuth and elevation grid space, which can represent a significant computational burden.

Thirdly, every mobile device 11, 12 runs the algorithm, but processing at the array-antenna side keeps unchanged. Thus, the total processing resource use, power consumption etc. for the system increases significantly as more mobile devices are added.

In these embodiments of the invention, the mobile devices 11, 12 in a mobile-centric system do not need to have the calibration matrix nor perform correlation between the correlation matrix and the received signal vector. Instead, much of the processing is performed at the transmitter side of the system and the mobile device performs only a relatively simple calculation.

In brief, an array-antenna transmits N*M packets in one positioning period, and can do so periodically. Mobile devices 11, 12 can determine the values of n and m for a given packet, for instance by demodulating the values of n and m from the packets. Then, conjugate calibration data of every channel/path and polarisation indexed by current n and m is transmitted according to a particular switching pattern, i.e., there are 2*K switched transmissions/time-slots after indexes n and m are broadcast. For example, if the vertically polarised component of channel/path k is selected at one time slot according to the switching pattern, the transmitted complex baseband signal is C[0][n][m][k]−C[1][n][m][k]*i.

At the mobile device, received complex signals are accumulated to one complex variable T as:

$$T[0]=T[0]+S[0][k]$$

$$T[1]=T[1]+S[1][k]$$

where, T[0] is the I component and T[1] is the Q component; T[0] and T[1] are initialised to zeros at the beginning of each receiving packet; and S[0][k] and S[1][k] are I and Q components of the kth receiving time slot in that packet.

At the end of each packet, a correlation metric R is calculated, for instance as $R=T[0]^2+T[1]^2$. The values of n and m in the packet with the largest correlation metric represents the bearing to the transmitter.

Instead of transmitting conjugate calibration data of each channel/path and polarisations in one packet, data which leads to a minimum accumulation in the mobile device may be transmitted.

Some non-limiting embodiments will now be described. These embodiments are based on some representative parameters, including number of antenna elements in the transmit antenna array and values of N and M. It will be readily appreciated that these are for example and that various alternatives are possible.

To achieve 10 degree accuracy, the azimuth angle range [0, 360] is divided into 36 grids and the elevation angle range [0, 90] is divided into 9 grids, i.e. N=9 and M=36. There are 2 antenna elements providing 5 channels/paths in the array-antenna 126 in the beacon 30 (K=5), and channel 0 has an omnidirectional pattern. In each positioning period, total N*M=9*36=324 packets are transmitted.

Figure 2:
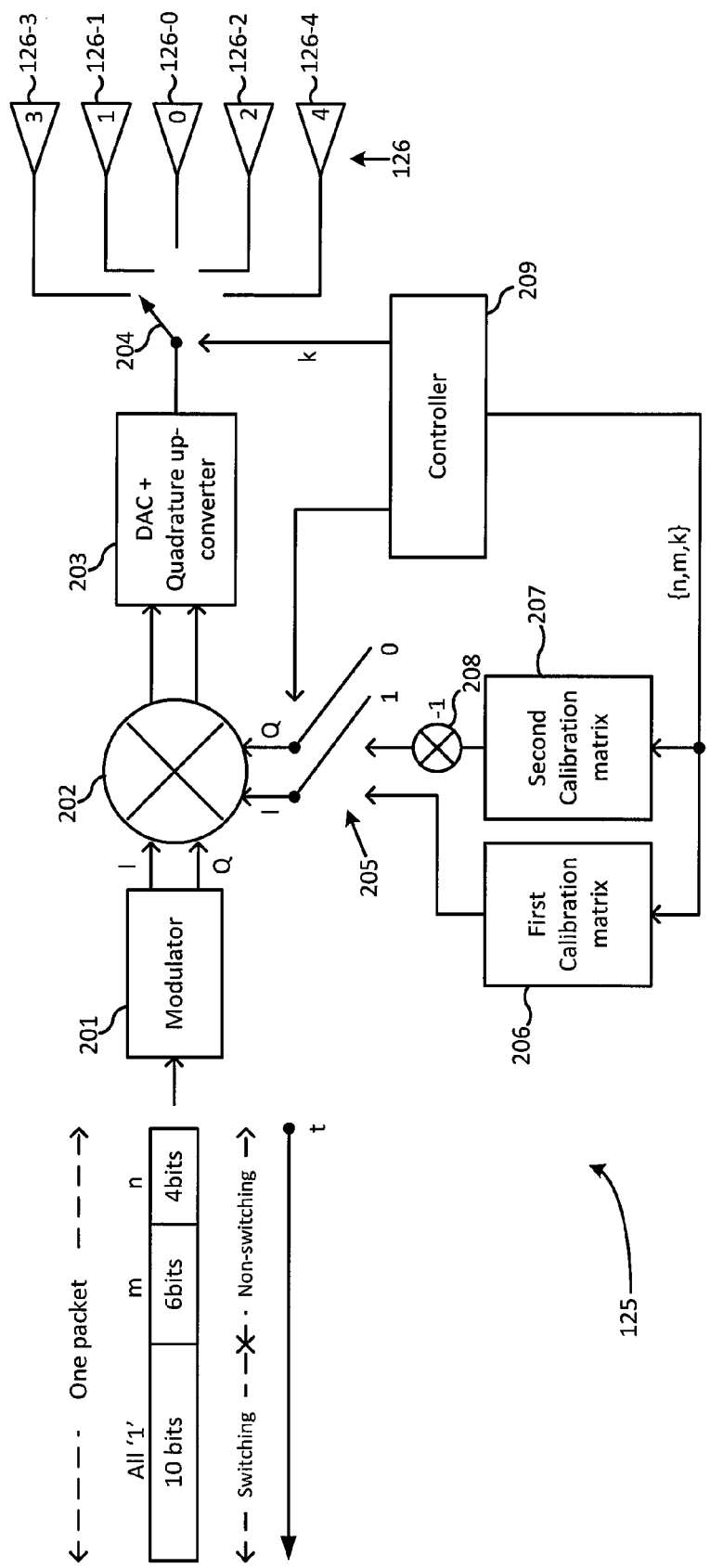
FIG. 2 is a schematic diagram of a transmitter and antenna of a beacon according to aspects of the invention and operating according to aspects of the invention, the beacon being part of the FIG. 1 system.

Referring to FIG. 2, a transmit chain of the BLE module 125 of the beacon 30 is shown along with the antenna 126. The BLE module 125 includes a chain comprising in the following sequence a modulator 201, a complex multiplier 202, a digital-to-analogue converter (DAC) and quadrature up-converter module 203, a first switch 204 and the antenna 126.

The modulator 201 is connected to receive packets from the processor 112, and one such packet is shown at the left side of the Figure. The modulator 201 provides I and Q outputs to first I and Q inputs of the complex multiplier 202. Second I and Q inputs of the complex multiplier 202 are connected to I and Q output throws of a second switch 205. I and Q outputs of the complex multiplier 202 are connected to I and Q inputs of the DAC and quadrature up-converter 203, which has a single output. The output of the DAC and quadrature up-converter 203 is connected to the single pole of the first switch 204. Multiple throws of the first switch 204 are coupled to respective ones of zeroth to fourth antenna element feed combinations 126-0 to 126-4 provided by the antenna 126. Each provides a path or channel and relates to a specific feed or feed combination of an antenna element. There are 5 paths because each antenna element has 2 feeds, one for each different polarization, forming 4 channels/paths. The fifth path comes from connecting both feeds of one antenna element, called the central antenna element, together. In general, if there are two feeds for an antenna element, two throws of the switch are connected to that antenna element, one to each feed. One throw of the switch is coupled to both feeds of a central antenna element. A first calibration matrix module 206 has its sole output coupled to a first pole of the second switch 205. A second calibration matrix 207 has its sole output coupled to a second pole of the second switch 205 via a multiplier 208, which multiplies −1 to the imaginary part of calibration matrix for constructing a conjugate complex value at second input port of the complex multiplier 202. The first calibration matrix module 206 includes values for indices 0 and 2 (the real parts of the first and second polarisation as recorded when signals are incident from differently polarised antennas of testing source in the chamber), and the second calibration matrix includes values for indices 1 and 3 (the imaginary parts of the first and second polarisations). If multiplier 208 causes extra delay, a delay element (not shown) added to the output of the first calibration matrix module 206 ensures that real and imaginary parts of one complex value arrive at the second input of the complex multiplier 202 at exactly the same time.

A controller 209, which may be the processor 112, has outputs coupled to allow control over various components.

The controller 209 provides a control signal to the control input of the first switch 204. The control signal is the current value of k, so causing switching between successive paths 126-0 to 126-4, involving different antenna element feeds and feed combinations, as the value of k changes.

The controller 209 provides a control input to the second switch 205. This allows the controller 209 selectively to provide outputs of the calibration matrix modules 206, 207 to the second I and Q inputs of the complex multiplier 202.

The controller 209 also provides values of n, m and k to the calibration matrix modules 206, 207.

The controller 209 also considers the circuit delay of the DAC and quadrature up-converter 208, the complex multiplier 202, the multiplier 203 and the first switch 204 to make sure that, when channel/path k data from the calibration matrix modules 206, 207 arrive at the switch 204, the switch 204 is connected to the correct channel/path k.

The modulator 201 performs digital complex baseband modulation. The modulator 201 may be an existing BPSK, GMSK, GFSK, etc. baseband module in a WiFi, Bluetooth, etc. radio. In this embodiment, it is a BLE modulator 201.

The complex multiplier 202 multiplies complex signals at its first and second inputs and provides the result of the multiplication to its outputs.

The DAC and quadrature up-converter 203 receives quadrature digital signals from the complex multiplier 202, converts them into analogue representations, and upconverts the result, for provision to one of the paths 126-0 to 126-4 as controlled by the first switch 204.

The first and second calibration matrix modules 206, 207 store matrices. A matrix comprises calibration data. The calibration data in a matrix comprises a value for each combination of n, m and k. The calibration data is the data derived from calibrating the antenna 126 (or an antenna that has the same configuration) in a chamber. The matrices are stored in non-volatile memory, for instance the ROM 124. They may also be stored temporarily in volatile memory, such as the RAM 123.

In fact, each of the first and second calibration matrix modules 206, 207 stores two matrices. One matrix relates to one polarisation (e.g. vertical polarisation), and the other relates to another polarisation (e.g. horizontal polarisation).

One packet is composed of 20 bits. The first 10 bits are sent in a non-switching interval, and the following 10 bits are sent in a switching interval. In the non-switching interval, 4 bits represent the n value, and 6 bits represent the m value (in this example N=9, M=36, so 4 bits and 6 bits are enough). The other 10 bits are all data value '1' and are sent in the switching interval. There are 10 bits needed for the switching interval because there are five channels/paths (provided by the antenna element feeds and feed combinations) and two different polarisations.

The transmitter working procedure in one positioning period can be summarised as follows:

For n=0:N−1
    For m=0:M−1
        Send one packet of corresponding n and m:
            Send the first 10 bits in the non-switching interval.
            Send the second 10 bits in the switching interval.
    End
End In the non-switching interval, the second switch 205 is switched to number pair {1, 0} to ensure that the outputs of the modulator 201 are unchanged by the complex multiplier 202. Also, the first switch 204 is switched to channel 0 (channel 126-0, which is connected to both polarisation feeds of the central antenna element) to ensure omnidirectional transmission. The first 10 bits are sent in the non-switching interval.

In the switching interval, the second switch 205 is switched to downside (the poles are connected to the throws) so that I and Q values from the calibration matrix modules 206, 207 are provided to the complex multiplier 202. The controller 209 repeats sending 0~K−1 (i.e. 0, 1, 2, 3, 4, 0, 1, 2, 3, 4) twice to the first switch 204, and the first switch 204 is switched to the channels/paths 126-0 to 126-4 according to the value of k. In the first time sending 0~K−1 (i.e. 0, 1, 2, 3, 4) from the controller 209, the first calibration matrix module 206 outputs C[0][n][m][k] and the second calibration matrix module 207 outputs C[1][n][m][k] to complex multiplier 202. On the second occurrence of sending 0~K−1 from the controller 209, the first calibration matrix module 206 outputs C[2][n][m][k] and the second calibration matrix module 207 outputs C[3][n][m][k] to the complex multiplier 202. Thus, in the first time sending 0~K−1 the signal is derived from calibration data derived from one testing source antenna polarisation in the chamber and in the second time sending 0~K−1 the signal is derived from calibration data derived from the other testing source antenna polarisation in the chamber. The second 10 bits are sent in the switching interval.

Figure 3:
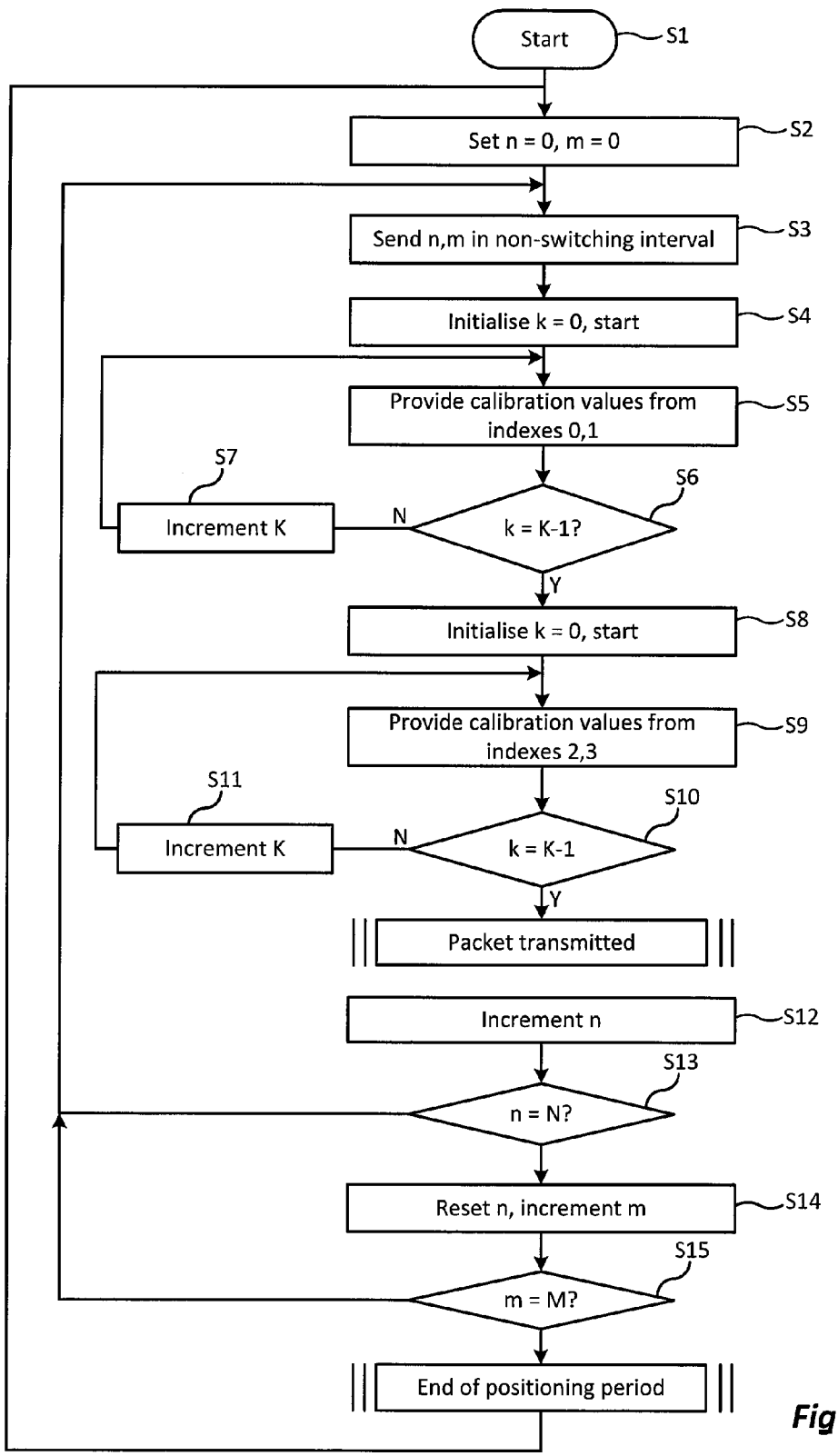
FIG. 3 is a flow chart illustrating operation of the beacon of FIG. 2 according to embodiments of the invention.

This is illustrated in more detail in the flow diagram of FIG. 3, which is an operation performed by the BLE module 125 and antenna 126 of FIG. 2. The operation begins at step S1.

At step S2, the values of n and m are initialised at 0. At step S3, the values of n and m are sent in non-switching mode. Here, the second switch 205 is switched to number pair {1, 0} to ensure that the outputs of the modulator 201 are unchanged by the complex multiplier 202. Also, the first switch 204 is switched to channel 0 (path 126-0) to ensure omni-transmission.

At step S4, k is initialised to 0 and the switching interval starts for the first sweep of k to from 0 to K−1.

At step S5, values from the zeroth and first indexed calibration matrices stored in the calibration matrix modules 206, 207 are provided to the complex multiplier 202. Here, the second switch 205 is switched to downside (the poles are connected to the throws) so that I and Q values from the calibration matrix modules 206, 207 are provided to the complex multiplier 202 and the calibration matrix modules 206, 207 are controlled by the controller 209 to access the zeroth and first indices. The values provided from the matrices depends on the values of n, m and k, all of which are provided by the controller 209. In step S5, the first calibration matrix module 206 outputs C[0][n][m][k] and the second calibration matrix module 207 outputs C[1][n][m][k] to the complex multiplier 202.

At step S6, it is determined whether the value of k is equal to K−1, which would indicate that the first sweep of k is complete. On a negative determination, k is incremented at step S7 and the operation then returns to step S5. On a positive determination, the operation proceeds to step S8. As such, step S5 is performed for each value of k from 0 to K−1. For each value of k, a value is provided from the zeroth index of the calibration matrix stored in the first calibration matrix module 206 to the second I input of the complex multiplier 202. For each value of k, also, a value is provided from the first index of the calibration matrix stored in the second calibration matrix module 207 to the second Q input of the complex multiplier 202. Incrementing k also causes the first switch 204 to connect the output of the DAC and quadrature up-converter 203 to the next channel/path 126-0 to 126-4.

At step S8, k is initialised to 0 and the switching interval starts for the second sweep of k to from 0 to K−1.

At step S9, values from the second and third indexed calibration matrices stored in the calibration matrix modules 206, 207 are provided to the complex multiplier 202. Here, the second switch 205 is switched to downside (the poles are connected to the throws) so that I and Q values from the calibration matrix modules 206, 207 are provided to the complex multiplier 202 and the calibration matrix modules 206, 207 are controlled by the controller 209 to access the second and third indices. The values provided from the matrices depends on the values of n, m and k, all of which are provided by the controller 209. In step S9, the first matrix module 206 outputs C[2][n][m][k] and the second calibration matrix module 207 outputs C[3][n][m][k] to the complex multiplier 202.

At step S10, it is determined whether the value of k is equal to K−1, which would indicate that the second sweep of k is complete. On a negative determination, k is incremented at step S11 and the operation then returns to step S9. On a positive determination, the operation proceeds to step S12. As such, step S9 is performed for each value of k from 0 to K−1. For each value of k, a value is provided from the second index of the calibration matrix stored in the first calibration matrix module 206 to the second I input of the complex multiplier 202. For each value of k, also, a value is provided from the third index of the calibration matrix stored in the second calibration matrix module 207 to the second Q input of the complex multiplier 202. Incrementing k also causes the first switch 204 to connect the output of the DAC and quadrature up-converter 203 to the next channel/path 126-0 to 126-4.

Once step S10 yields a positive determination, the packet transmission has completed, and the BLE module 125 powers down until the next packet transmission. Also, at step S12 the value of n is incremented.

At step S13, it is determined whether the value of n is equal to N, which would indicate that a packet has been transmitted for the whole range of n, for a given value of m. On a negative determination, the operation returns to step S3, repeating steps S3 to S12 for the next value of n. On a positive determination from step S13, the value of n is reset to 0 and the value of m is incremented at step S14. This causes n to be reset once the full range has been handled, and causes progression to the next value of m.

At step S15, it is determined whether the value of m is equal to M, which would indicate that a packet has been transmitted for the whole range of m. On a negative determination, the operation returns to step S3, repeating steps S3 to S12 for the next value of n, and then for each other value of n in the range. On a positive determination from step S15, indicating the end of a positioning period in which a packet has been transmitted for each combination of n and m, the operation returns to start another positioning period at step S2.

It will be appreciated from the above that the controller 209 repeats sending 0~K−1 twice (i.e. 0, 1, 2, 3, 4, 0, 1, 2, 3, 4) to the first switch 204, and the first switch 204 is switched to the channels/paths 126-0 to 126-4 according to the value of k.

The result of this transmitter operation is to send in the switching interval in a given positioning packet signals that are derived from calibration data for a particular segment of the azimuth and elevation range, which can also be termed a particular angle grid, for both testing source antenna polarisations. Also, the particular segment or angle grid is identified in the non-switching interval, by the values of n and m. This can allow a mobile device 11, 12 to identify the segment or angle grid in which it is located without the mobile device having the calibration data.

Figure 4:
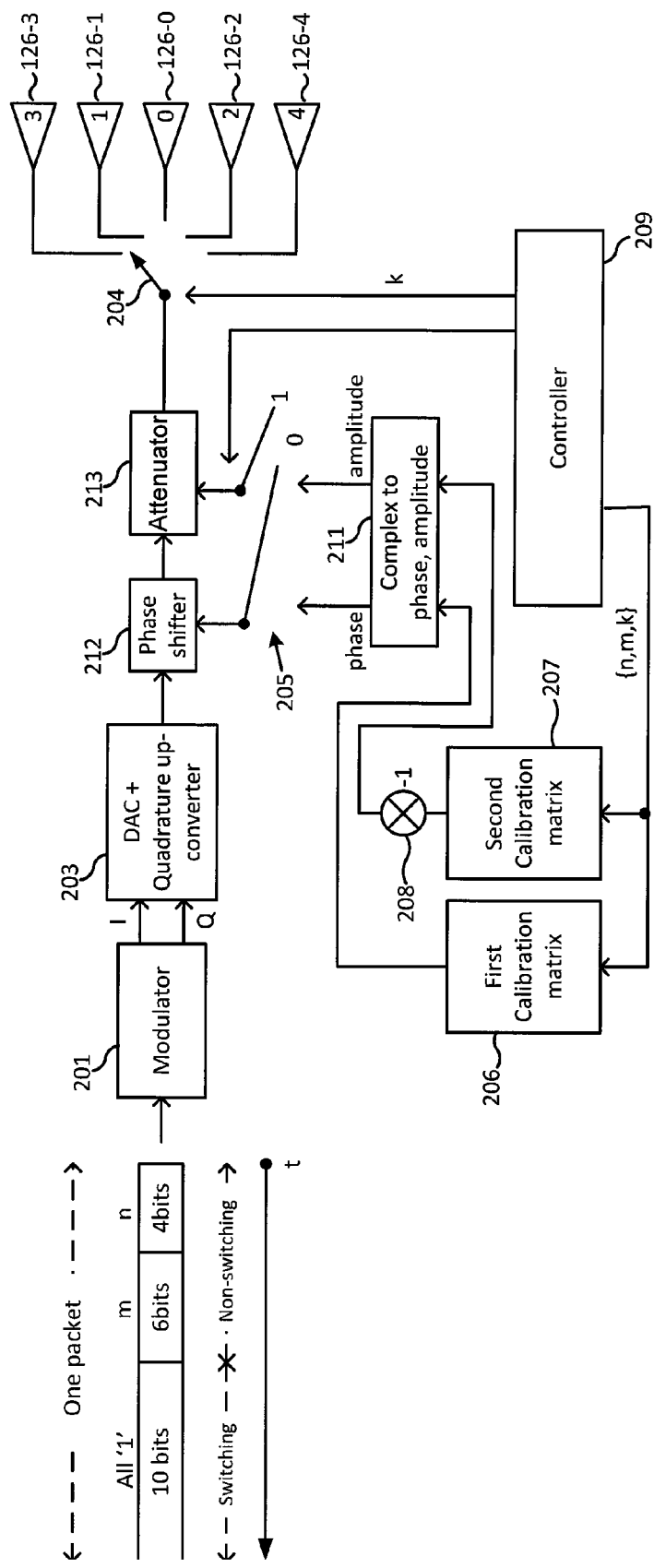
FIG. 4 is a schematic diagram of an alternative transmitter and antenna of a beacon according to aspects of the invention and operating according to aspects of the invention, the beacon being part of the FIG. 1 system.

The baseband complex multiplier shown in FIG. 2 may be replaced by a phase shifter and attenuator in the RF chain whilst producing the same transmitted signals. This alternate BLE module 125 is shown in FIG. 4. Here, reference numerals are retained from FIG. 2 for like elements.

In the transmitter of FIG. 4, the complex multiplier 202 is omitted. Instead the quadrature inputs of the DAC and quadrature up-converter are connected directly to the I and Q outputs of the modulator 201. Also, a complex to phase and amplitude converter module 211 is coupled to the I and Q outputs of the first and second calibration matrix modules 206, 207. This converts the I and Q outputs provided by the first and second calibration matrix modules 206, 207 respectively to phase and amplitude signals. These are provided respectively to control inputs of a phase shifter 212 and an attenuator 213, which are connected in series between the output of the DAC and quadrature up-converter 203 and the pole of the first switch 204.

The phase shifter 212 adjusts the phase of the signal provided by the DAC and quadrature up-converter 203 based on the values provided by the first and second calibration matrix modules 206, 207, as converted by the complex to phase and amplitude converter module 211.

The attenuator 213 adjusts the amplitude of the signal provided by the DAC and quadrature up-converter 203 (after phase shifting) based on the values provided by the first and second calibration matrix modules 206, 207, as converted by the complex to phase and amplitude converter module 211.

The signals resulting from the FIG. 4 transmitter are, for ideal circuit elements, the same as the signals resulting from the FIG. 2 BLE module 125.

Figure 5:
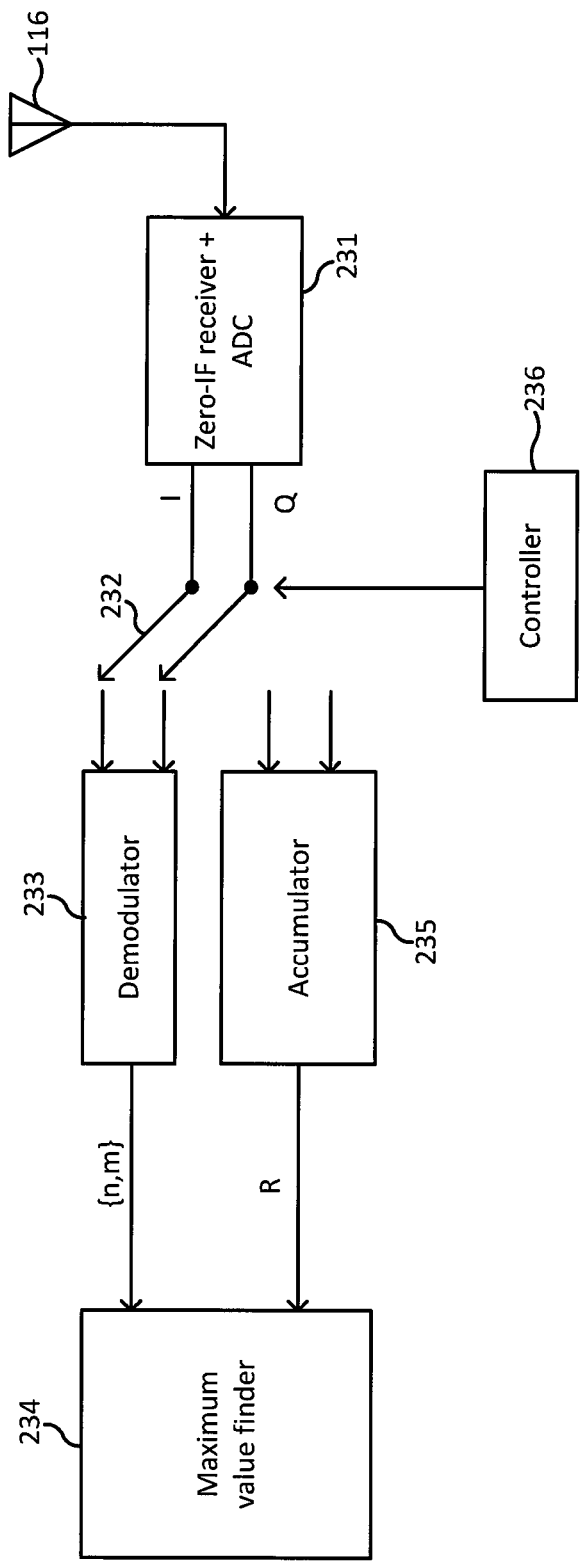
FIG. 5 is a schematic diagram of a receiver of a mobile device according to aspects of the invention and operating according to aspects of the invention, the mobile device being part of the FIG. 1 system.

A receive chain of the BLE module 113 of the mobile device 11 will now be described with reference to FIG. 5.

The antenna 116 of connected to an input of a radio receiver and analogue-to-digital converter (ADC) 231. Here, the radio receiver is a zero IF or direct conversion receiver. Of course, the radio receiver and the ADC may be discrete components.

I and Q outputs of the ADC 231 are coupled to different poles of a switch 232. The switch 232 is a double pole, double throw switch. First throws of the switch 232 are coupled to I and Q inputs of a demodulator 233. Second throws of the switch 232 are coupled to I and Q inputs of an accumulator 235. Outputs of the accumulator 235 and the demodulator 233 are coupled to inputs of a maximum value finder 234. A controller 236 has an output coupled to a control input of the switch 232.

The switch 232 is configured to couple the I and Q outputs of the ADC 231 either to the I and Q inputs of the demodulator 233 or the I and Q inputs of the accumulator 235 depending on the control output provided by the controller 236.

The controller 236, which may be the processor 112, is configured to cause the switch to couple the I and Q outputs of the ADC 231 to the I and Q inputs of the demodulator 233 for the part of each received packet corresponding to the non-switching interval. The controller is configured to cause the switch to couple the I and Q inputs of the accumulator 235 to the I and Q outputs of the ADC 231 for the part of each received packet corresponding to the switching interval.

The controller 236 may be trigged by the BLE demodulator 233 when a packet arrives, and is then configured to count the received number of bits to identify the point at which the switching point between the non-switching interval and the switching interval occurs.

The demodulator 233 is configured to demodulate the values of n and m from the (non-switching interval of the) received packets and provide the demodulated values to the maximum value finder 234.

The accumulator 235 is configured to accumulate values from the signals received during the switching part of the packets. The accumulator 235 is configured also to calculate a correlation metric from the accumulated values.

For instance, the accumulator 235 may be configured to accumulate values using by applying:

$$T[0]=T[0]+S[0][k]; \text{ and}$$

$$T[1]=T[1]+S[1][k];$$

Where, T[0] is the value of the I component and T[1] is the value of the Q component. Here, T[0] and T[1] are initialised to zeros prior at the beginning of each packet. S[0][k] and S[1][k] are values of the I and Q components during the kth time slot in that packet.

At the end of each packet, the correlation metric R can be calculated by the accumulator 235 as $R=T[0]^2+T[1]^2$, i.e. a sum of squares.

The maximum value finder 234 is configured to identify the packet that produced the largest correlation metric R. This can be done in any of a number of ways.

For instance, the maximum value finder 234 may, before each positioning period, initialise the correlation metric R, and the angle index {n, m} by 0, −1 and −1 respectively in memory, for instance the RAM 113.

After processing each packet, if the value of R of that packet is determined by the maximum value finder 234 to be larger than the currently stored value of R, then the maximum value finder 234 stores the values of R and {n, m} of the current packet in place of the previously stored R and {n, m} in the memory. If the value of R of the packet is determined by the maximum value finder 234 to be larger than the currently stored value of R, the values of R, n and m of the current packet are discarded. In this way, after each positioning period, the values of {n, m} stored in the memory represents the segment containing the direction to the mobile device 11 from the beacon 30.

Figure 6:
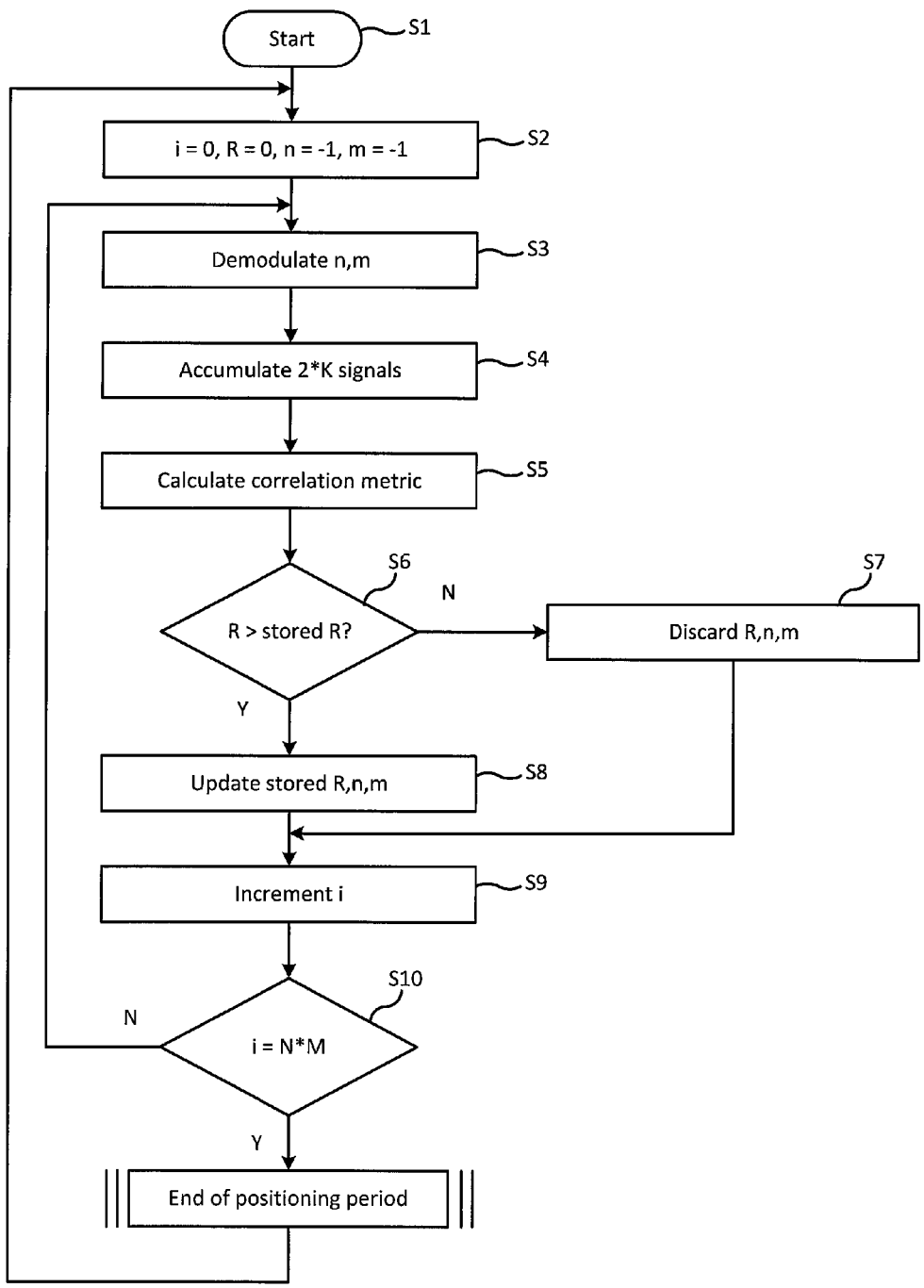
FIG. 6 is a flow chart illustrating operation of the mobile device of FIG. 6 according to embodiments of the invention.

Operation of the mobile device 11 in determining the bearing will now be described with reference to FIG. 6.

The operation begins at step S1. At step S2, a packet count i is initialised to 0. Values of the correlation metric R, and the angle index {n, m} are initialised to 0, −1 and −1 respectively in memory, for instance the RAM 113.

At step S3, values of n and m are demodulated by the demodulator 233. At this stage, the controller 236 is controlling the switch 232 to connect the I and Q outputs of the receiver and ADC 231 to the demodulator 233.

At step S4, the accumulator 235 accumulates the signals received over 2*k signals. At this stage, the controller 236 is controlling the switch 232 to connect the I and Q outputs of the receiver and ADC 231 to the accumulator 235. The controller 236 switches the switch 232 between steps S3 and S4, and switches it back again after S4 and before S3 is performed for the next packet.

This accumulation comprises accumulating signals over the first k signals and separately accumulating the signals over the second k signals. This produces different accumulations for the different calibration source antenna polarisations.

At step S5, the accumulator calculates a correlation metric for the received packet. This may comprise summing the squares of the two different accumulations calculated in step S5.

At step S6, it is determined whether the correlation metric for the current packet is greater that the value of R stored in the memory. On a negative determination, the values of R, n and m for the current packet are discarded at step S7. On a positive determination, the stored values of R, n and m are updated with the values from the current packet. This means that the values of n and m are updated if the current packet has a higher correlation metric than any packet previously received in the current positioning period.

Following step S7 or step S8, the value of i is incremented at step S9.

At step S10, it is determined whether the value of i is equal to the sum of N and M, which would indicate that all the packets in the positioning period have been processed. On a negative determination, the operations returns to step S3 to process the next packet. On a positive determination, the operation may returns to step S2 to process the packets in the next positioning period, or the operation may end. On a positive determination from step S10, the values of n and m stored in the memory indicate the segment in which the direction from the beacon 30 to the mobile device 11 lies, in terms of azimuth and elevation angle. The values of n and m are output as an indication of the direction. The mobile device 11, 12 uses stored information defining the relationship between values of n and m to convert the direction into a form that can be used by the mobile device 11, 12 to calculate its position from the location and orientation of the beacon 30.

This operation can be summarised as follows:
For n=0:N−1
  For m=0:M−1
    Receive one packet over the air:
      In non-switching interval, demodulate {n, m}
      In switching interval, accumulate I and Q, calculate correlation metric R
  End
End In the above, the switching pattern at the beacon 30 comprises two identical sequences one after the other, i.e. 0 to K−1 then 0 to K−1 again. This is merely an example and other switching patterns, and general principles in formulating switching patterns, have been invented.

For x paths/channels, and a centre or reference path being path/channel 1, a switching pattern may take the form:
  1, 2, 1, 3, 1, 4, . . . x, 1, 2 . . . .

Here, there is one other path/channel between different instances of the reference channel. The part of the sequence up to and including the x denotes the first subsequence and the 1, 2 . . . after the x denotes the beginning of the second subsequence. The first and second subsequences together form the overall sequence.

Alternatively, there may be two other paths/channels between different instances of the reference channel, as follows:
  1, 2, 3, 1, 4, 5, 1, . . . x, 1, 2, 3 . . . .

Further alternatively, there may be three other paths/channels between different instances of the reference channel, as follows:
  1, 2, 3, 4, 1, 5, 6, 7, 1 . . . .

Alternatively, two instances of a path/channel may be provided between two instances of the reference channel, for instance as:

1, 2, 2, 1, 3, 3, 1, 4, 4 . . . .

It has been determined that it is advantageous to provide a switching pattern with two or more different channel numbers between two instances of a reference channel, in which each channel occurs at least twice and the sequence of channels other than the reference channel is mirrored.

For example, if there are two channel numbers x and y between instances of a reference channel (1), the switching pattern is best formed to include:

1 x y y x 1 or 1 y x x y 1

If there are three channel numbers x y, and z between instances of a reference channel (1), the switching pattern is best formed to include 1 x y z z y x 1 or 1 x z y y z x 1 or 1 y x z z x y 1 or
1 y z x x z y 1 or 1 z y x x y z 1 or 1 z x y y x z 1

If there are five channel numbers including a reference channel (1), the switching pattern may be best formed as:

1 2 3 3 2 1 4 5 5 4 1 or 1 5 2 2 5 1 3 4 4 3 1 or 1 3 4 5 5 4 3 1 2 2 1 etc.

In these patterns, the first and second subsequences are intermingled. In particular, one or more parts of the first subsequence and one or more parts of the second subsequence are provided between different instances of the reference channel. With such switching patterns, the controller 209 controls each of the calibration matrix modules 206, 207 to switch between the different matrices frequently, as the switching between the first subsequence and the second subsequence occurs potentially many times in the transmission of once sequence.

In these examples, the reference channel advantageously is provided as the first and last part of the sequence, and may also be provided at one other location in the sequence. The provision of the reference channel in the switching sequence allows a receiving mobile device 11, 12 better to use the received signal to position itself. Channels other than the reference channel are provided only twice each in the sequence.

Other switching patterns conforming the rules above will be apparent to the skilled person.

The switching pattern used by a beacon 30 may be communicated to mobile devices in any suitable way. For instance, an identifier of the switching pattern could be communicated in an advertising message, for instance the same advertising message in which the antenna type identifier is provided.

A number of advantages derive from the above-described operation.

Firstly, the mobile device 11 does not need to know the calibration matrix. This reduces the amount of memory needed to be used by the mobile device 11. It may also reduce the quantity of data that needs to be downloaded by the mobile device 11, reducing power consumption, network utilisation, data usage costs, etc.

Secondly, the positioning algorithm in the mobile device 11 is much simpler than if processing using the calibration matrix is needed. Thus, power consumption in the mobile devices is lower, and there is a lower utilisation of processing resources. Where multiple mobile devices 11 are present, overall system power consumption is lower.

Thirdly, positioning accuracy or resolution is not dependent on the ability (memory, compute speed, storage, etc.) of the mobile device 11. Instead, positioning accuracy/resolution is dependent on the network side, in particular the values of N and M.

Fourthly, privacy of the mobile device 11 is ensured because the mobile device 11 is not required to transmit any information about its location, or indeed any signals at all.

These advantages are achieved with a relatively small increase in the complexity of the hardware in the beacon 30.

There is a disadvantage in that the time to obtaining positioning may be longer, in particular because the mobile device 11 needs to receive N*M packets in order to ensure that the packet giving rise to the maximum correlation metric (and thus the correct direction) is received. The number of packets in a positioning period determines the time that it takes for a mobile device 11 to obtain the direction to the beacon 30.

The choice of values for N and M is selected as a balance between resolution of the direction (the higher the values, the higher the resolution) and the number of packets needed to be received to determine the direction (the higher the values, the more packets need to be received).

Two ways of decreasing positioning time for given values of N and M will now be described.

Firstly, the interval between transmitting successive positioning packets may be reduced.

Secondly, the switching rate at the beacon 30, i.e. the rate at which k is incremented in the switching period, is increased. This reduces the duration of the packets.

Thirdly, advanced MAC/scheduler can be used for transmitting at the beacon 30. For instance, the beacon 30 may transmit packets in a positioning period relating firstly to one set of criteria, and then in a subsequent positioning period to some other criteria.

For instance, the beacon 30 may transmit all angle grids at several positioning periods, and in each period with a larger grid step (coarse grid) and with grid index shifting. This allows a mobile device 11, 12 entering the positioning range of the beacon 30 to obtain a position fix more quickly (because of shorter positioning period) but with lower accuracy (because of bigger angle grid step). If the device 11 resides in the area covered by the beacon 30 for a longer period, by collecting different shifting version of coarse grid, accuracy can be improved along with the residing time. Taking a 1-D angle grid as example, in total 16 angles are sent in sequential 4 positioning periods as follows:

| Period 0: | 0 | 4 | 8  | 12 |
| Period 1: | 1 | 5 | 9  | 13 |
| Period 2: | 2 | 6 | 10 | 14 |
| Period 3: | 3 | 7 | 11 | 15 |

Alternatively, the beacon 30 may firstly transmit packets relating to a coarse grid (for instance with relatively small values of N and M) and then transmit packets in a positioning period relating to a finer grid (for instance, a subsection of the course grid, but at a higher resolution).

Alternatively, the beacon 30 may firstly transmit packets relating to a subset of the antenna elements 126 and then transmit packets in a positioning period relating to different subset of the antenna elements 126.

Further alternatively, the beacon 30 may firstly transmit packets relating to one section of the whole azimuth and elevation grid (for instance a segment directly downwards from the beacon) and then transmit packets in a positioning period relating to a different section of the whole azimuth and elevation grid (for instance a segment that is sideways adjacent to the downwards segment).

Still further alternatively, the beacon 30 may firstly transmit packets relating to a higher priority section of the whole azimuth and elevation grid (for instance a segment directed at a doorway or a barrier) and then transmit packets in a positioning period relating to a lower priority section of the whole azimuth and elevation grid (for instance a segment that is away from the doorway or barrier).

It will be appreciated that various alternatives and variations are available, and some will now be described.

Instead of transmitting conjugate calibration data of each channel/path and polarisation in one packet, as described above, the calibration matrices may instead be provided with values that give rise to nulling at the correct direction, as generated from nulling processing of the calibration matrices. Here, the values in the calibration matrices leads to accumulation in the mobile device that has a minimum (instead of a maximum) at the direction to the mobile device 11 from the beacon. In these embodiments, the values for the metric R, index n and index m are initialised by positive infinity, −1 and −1 respectively before each positioning period. After processing each packet, if the correlation metric R of that packet is smaller than previously stored R in memory, R and {n, m} of current packet replace the stored values. Otherwise, the metric R and the indices n and m of the current packet are discarded.

Although in the above a DAC and quadrature up-converter 203 receives quadrature digital signals from the complex multiplier 202, converts them into analogue representations, and upconverts the result, for provision to one of the antenna elements 126-0 to 126-4 as controlled by the first switch 204, the DAC may be provided as a component separate to the upconverter.

Although transmission occurs for two different calibration source antenna polarisations in the above, in other embodiments only one calibration source antenna polarisation is used. This reduces the accuracy of positioning and the reliability of measurements, but simplifies the BLE module 125, reduces the number of calibration matrices stored in the matrix modules 206, 207 (by a factor of two), and reduces the processing needed in the mobile device 11.

Although in the above each antenna element in the antenna 126 has feeds for two different polarisations, in other embodiments only one polarisation is used for each antenna element. This reduces the accuracy of positioning and the reliability of measurements, but simplifies the BLE module 125 and antenna hardware 126.

Although in the above the values of n and m are included within the AoD packets, this data may instead be communicated to the mobile devices 11, 12 in some other way.

For instance, a first AoD packet may be provided with a marker, and the mobile devices 11, 12 can then count subsequent packets and use knowledge of the packet sequence to infer values of n and m for a current packet.

In some embodiments, N may have a value of 1. Here, M packets (if N=1, M*N=M) are transmitted in a positioning period. A mobile device 11, 12 may be able to determine its location by triangulating its position from two or more beacons 30.

The beacon 30 may be configured with calibration matrices in any suitable way.

For instance, the beacon 30 may be configured with calibration matrices on manufacture or initial, factory configuration. Alternatively, the beacon 30 may be configured with calibration matrices by the server 40, for instance through an Ethernet connection.

It will be appreciated that the above-described embodiments are not limiting on the scope of the invention, which is defined by the appended claims and their alternatives. Various alternative implementations will be envisaged by the skilled person, and all such alternatives are intended to be within the scope of the claims. A number of alternatives will now be described.

Although in the above the AoD positioning packets and the positioning advertisement messages are separate, they may instead be combined. For instance, an AoD tail can be added to a positioning advertisement message, allowing a mobile device 11, 12 to determine its position after having received only one message from a beacon. However, the inclusion of the AoD tail limits the number of bits available for communicating the other information needed by the mobile devices 11, 12.

Although in the above the positioning advertisement messages are transmitted on BLE advertising channels, it will be appreciated that the information communicated to the mobile devices 11, 12 in the positioning advertisement messages need not be communicated in this way. For instance, the positioning advertisement messages may be broadcast on one or more BLE data channels, for instance in SCAN_RSP containers.

Indeed, the invention is not limited to BLE. It will be appreciated that the concept underlying the above-described embodiments, as defined in the claims, is applicable to other systems in which the same considerations (e.g. limited bandwidth, positioning resolution etc.) are applicable. Other systems to which the invention may be applied and which are intended to be covered by the claims include unidirectional and bidirectional systems both present and future. Systems to which the invention may be applied include WiFi systems, pseudolite-based systems and such like.

Embodiments of the present invention may be implemented in software, hardware, application logic or a combination of software, hardware and application logic. The software, application logic and/or hardware may reside on memory, or any computer media. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer.

A computer-readable medium may comprise a computer-readable storage medium that may be any tangible media or means that can contain or store the instructions for use by or in connection with an instruction execution system, apparatus, or device, such as a computer as defined previously.

According to various embodiments of the previous aspect of the present invention, the computer program according to any of the above aspects, may be implemented in a computer program product comprising a tangible computer-readable medium bearing computer program code embodied therein which can be used with the processor for the implementation of the functions described above.

Reference to "computer-readable storage medium", "computer program product", "tangibly embodied computer program" etc, or a "processor" or "processing circuit" etc. should be understood to encompass not only computers having differing architectures such as single/multi processor architectures and sequencers/parallel architectures, but also specialised circuits such as field programmable gate arrays FPGA, application specify circuits ASIC, signal processing devices and other devices. References to computer program, instructions, code etc. should be understood to express software for a programmable processor firmware such as the programmable content of a hardware device as instructions for a processor or configured or configuration settings for a fixed function device, gate array, programmable logic device, etc.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

What is claimed is:

1. A method for a mobile user device, the method comprising:
   receiving, at the mobile user device, plural packets;
   for each packet, accumulating, at the mobile user device, signals received in a switching interval of the packet;
   deriving, at the mobile user device, a correlation metric for each of the packets from the accumulated signals for the packets;
   identifying, at the mobile user device, a packet with the best correlation metric;
   identifying, at the mobile user device, a direction associated with the packet identified as having the best correlation metric; and
   providing, at the mobile user device, the direction as an output.

2. The method as claimed in claim 1, wherein identifying the direction associated with the packet identified as having the best correlation metric comprises demodulating information identifying the direction from the packet.

3. The method as claimed in claim 1, wherein identifying the direction associated with the packet identified as having the best correlation metric comprises demodulating information identifying the direction received in a non-switching interval of the packet.

4. The method as claimed in claim 1, comprising, for each packet:
   accumulating signals received in a first part of the switching interval of the packet and relating to a first sequence;
   accumulating signals received in a second, different part of the switching interval of the packet and relating to a second sequence, and
   deriving a correlation metric for each of the packets from the first and second accumulated signals for the packets.

5. The method as claimed in claim 1, wherein identifying a packet with the best correlation metric comprises identifying a packet with the best correlation metric after determining that all packets within a positioning period have been received.

6. A mobile user device, comprising:
   at least one processor; and
   at least one memory including computer program code;
   the at least one memory and the computer program code configured to, with the at least one processor, cause the mobile user device at least to:
   receive plural packets;
   for each packet, accumulate signals received in a switching interval of the packet;
   derive a correlation metric for each of the packets from the accumulated signals for the packets;
   identify a packet with the best correlation metric;
   identify a direction associated with the packet identified as having the best correlation metric; and
   provide the direction as an output.

7. The mobile user device as claimed in claim 6, wherein identifying the direction associated with the packet identified as having the best correlation metric comprises demodulating information identifying the direction from the packet.

8. The mobile user device as claimed in claim 6, wherein identifying the direction associated with the packet identified as having the best correlation metric comprises demodulating information identifying the direction received in a non-switching interval of the packet.

9. The mobile user device as claimed in claim 6, wherein the at least one memory and the computer program code are further configured to, with the at least one processor, cause the mobile user device at least to, for each packet:
   accumulate signals received in a first part of the switching interval of the packet and relating to a first sequence;
   accumulate signals received in a second, different part of the switching interval of the packet and relating to a second sequence, and
   derive a correlation metric for each of the packets from the first and second accumulated signals for the packets.

10. The mobile user device as claimed in claim 6, wherein identifying a packet with the best correlation metric comprises identifying a packet with the best correlation metric after determining that all packets within a positioning period have been received.

11. A computer program product comprising a non-transitory computer readable medium having computer readable program code stored thereon, which when executed by a processor of a mobile user device, causes the mobile user device at least to perform:
   receiving plural packets;
   for each packet, accumulating signals received in a switching interval of the packet;
   deriving a correlation metric for each of the packets from the accumulated signals for the packets;
   identifying a packet with the best correlation metric;
   identifying a direction associated with the packet identified as having the best correlation metric; and
   providing the direction as an output.

12. The computer program product as claimed in claim 11, wherein identifying the direction associated with the packet identified as having the best correlation metric comprises demodulating information identifying the direction from the packet.

13. The computer program product as claimed in claim 11, wherein identifying the direction associated with the packet identified as having the best correlation metric comprises demodulating information identifying the direction received in a non-switching interval of the packet.

14. The computer program product as claimed in claim 11, wherein the non-transitory computer readable medium has computer readable program code stored thereon, which when executed by the processor of the mobile user device, causes the mobile user device at least to perform, for each packet:
   accumulating signals received in a first part of the switching interval of the packet and relating to a first sequence;
   accumulating signals received in a second, different part of the switching interval of the packet and relating to a second sequence, and deriving a correlation metric for each of the packets from the first and second accumulated signals for the packets.

15. The computer program product as claimed in claim 11, wherein identifying a packet with the best correlation metric comprises identifying a packet with the best correlation metric after determining that all packets within a positioning period have been received.

* * * * *